(12) United States Patent
Miyatake

(10) Patent No.: US 7,477,076 B2
(45) Date of Patent: Jan. 13, 2009

(54) LOW-VOLTAGE, LOW-POWER-CONSUMPTION, AND HIGH-SPEED DIFFERENTIAL CURRENT-SENSE AMPLIFICATION

(75) Inventor: Hisatada Miyatake, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 11/566,607

(22) Filed: Dec. 4, 2006

(65) Prior Publication Data
US 2008/0129345 A1   Jun. 5, 2008

(51) Int. Cl.
H03F 3/45 (2006.01)
(52) U.S. Cl. .................. 327/55; 327/56; 327/57
(58) Field of Classification Search ............ 327/55, 327/56, 57
See application file for complete search history.

(56) References Cited

U.S. PATENT DOCUMENTS

| | | | | |
|---|---|---|---|---|
| 5,654,928 A * | 8/1997 | Lee et al. | ............ | 365/205 |
| 5,856,748 A * | 1/1999 | Seo et al. | ............ | 327/53 |
| 6,137,319 A * | 10/2000 | Krishnamurthy et al. | ...... | 327/51 |
| 6,327,215 B1 * | 12/2001 | Ternullo et al. | ........ | 365/230.06 |
| 6,456,120 B1 * | 9/2002 | Huang | ............ | 326/115 |
| 6,538,476 B2 * | 3/2003 | Forbes | ............ | 327/57 |
| 6,538,947 B2 * | 3/2003 | Ahmed et al. | ............ | 365/207 |
| 6,944,066 B1 * | 9/2005 | Jing | ............ | 365/189.05 |
| 7,023,243 B2 * | 4/2006 | Wijetunga et al. | ............ | 327/57 |
| 7,038,962 B2 * | 5/2006 | Yamagami | ............ | 365/205 |
| 7,289,379 B2 * | 10/2007 | Chol et al. | ............ | 365/196 |

OTHER PUBLICATIONS

M. Breitwisch et al., "A novel CMOS compatible embedded non-volatile memory with zero process adder," Procs. of 2005 IEEE Int'l Workshop MTDT'05.

* cited by examiner

Primary Examiner—Kenneth B. Wells
(74) Attorney, Agent, or Firm—Riyon Harding

(57) ABSTRACT

A differential current-sensing amplifier includes two inverters, two resistors, a NOR gate, and five switches. The first inverter has a first output; the second inverter has a second output. The first resistor is connected between the first inverter and ground; the second resistor is connected between the second inverter and ground. A current to be sensed is input between the first resistor and the first inverter; a reference current is input between the second resistor and the second inverter. The first switch is connected between the first output and ground, the second switch is connected between the second output and ground, and the third switch is connected between the first and the second inverters and power. The first and the second switches are turned off, and the third switch is turned on, to compare the current to be sensed in relation to the reference current.

14 Claims, 4 Drawing Sheets

LOW-VOLTAGE, LOW-POWER-CONSUMPTION, AND HIGH-SPEED DIFFERENTIAL CURRENT-SENSE AMPLIFICATION

FIELD OF THE INVENTION

The present invention relates generally to current-sense amplification, such as differential current-sense amplification, and more particularly to such current-sense amplification that is low voltage, low power consumption, and high speed.

BACKGROUND OF THE INVENTION

Current-sense amplification is used in a variety of different applications. For example, memory circuits that are able to store a bit of information output a relatively high current if the bit is logic one, and a relatively low current if the bit is logic zero. Current-sense amplification is used to effectively amplify these currents, so that it is easier to discern between a logic one and a logic zero stored within a memory circuit. Such memory circuits include those in which memory information is conveyed by a change in transistor drain current, and/or where the transistor potential remains at a low level. Such memory circuits also include magnetic tunnel junction (MTJ)-magnetoresistive random access memory (MRAM), MTJ-MRAM: tunneling magnetoresistive (TMR), as well as other types of memory circuits, such as some types of programmable read-only memory (PROM).

FIGS. 1A and 1B show conventional sense amplifiers, according to the prior art. More specifically, FIG. 1A shows a differential current-sense amplifier that uses a current mirror load, whereas FIG. 1B shows a cross-coupled sense amplifier that is commonly used for dynamic random access memory (DRAM). In FIG. 1A, the signal to be sensed is input at terminal IN, and the opposite of the signal to be sensed is input at terminal INN. The output of the signal to be sensed is provided at terminal OUT, and is high when the signal is high, and low when the signal is low. In FIG. 1B, the signal to be sensed is input at terminal DIO, and the opposite of the signal to be sensed is input at terminal DION. If the signal is relatively high, the terminal DIO is amplified to the power supply potential, and otherwise to the ground potential. If the signal is relatively low, the terminal DION is amplified to the power supply potential, and otherwise to the ground potential.

In FIG. 1A, the output of the differential current-sense amplifier never reaches logic level. As a result, to obtain a logic level output, a backend amplifier is required, and circuits, such as a bias circuit, for the configuration and control of a constant current source are also required. Furthermore, the differential current-sense amplifier of FIG. 1A is asymmetric, and therefore to obtain symmetric output, it is common to arrange two instances of this amplifier in parallel. Finally, current flows through the amplifier at all times, and also the control circuit which generates a potential, or voltage, to be provided to the device used as the constant current source in the amplifier consumes direct current (DC).

In both FIGS. 1A and 1B, due to the threshold voltage of the transistors that have to be used, input potential cannot have a value that is close to the potential of the power source itself or the ground potential. When current is sensed, by adding a resistor and applying an input current to the resistor, the terminal voltage of the resistor is used for current sensing. In this situation, the terminal voltage of the resistor has to be raised to an intermediate potential. As a result, the potential of a memory device being sensed will be halfway between the potential of the power source and the ground potential. This is problematic for memory devices in which potential cannot be raised to extract a current, such as MTJ-MRAM devices and the memory devices for PROM's, for instance. For these and other reasons, therefore, there is a need for the present invention.

SUMMARY OF THE INVENTION

The present invention relates to low-voltage, low-power-consumption, and high-speed differential current-sense amplification. A differential current-sensing amplifier of one embodiment of the invention includes two inverters, two resistors, and three switches. The first inverter has a first output connected to the input of the second inverter and the second inverter has a second output connected to the input of the first inverter. The first resistor is connected between the first inverter and ground, and the second resistor is connected between the second inverter and ground. A current to be sensed is input between the first resistor and the first inverter, and a reference current is input between the second resistor and the second inverter. The first switch is connected between the first output and ground, the second switch is connected between the second output and ground, and the third switch is connected between the first and the second inverters and power. The first and the second switches are turned off, and the third switch is turned on, to compare the current to be sensed in relation to the reference current.

The amplifier further includes a fourth switch, a fifth switch, and a NOR gate. The fourth switch connects the current to be sensed to a point between the first resistor and the first inverter. The fifth second connects the reference current to a point between the second resistor and the second inverter. The NOR gate has inputs connected to the first and the second outputs, and an output controlling the fourth and the fifth switches.

A differential current-sensing amplifier of another embodiment of the invention includes two inputs, two outputs, and a number of switches. The first input receives a current to be sensed, and the second input receives a reference current. The first output indicates whether the current to be sensed is greater than the reference current, and the second output indicates whether the current to be sensed is less than the reference current. The switches control comparing of the current to be sensed in relation to the reference current. Current from the power supply just momentarily flows through the differential current-sensing amplifier, only after the switches have been actuated to control comparing of the current to be sensed in relation to the reference current, and current from the power supply does not otherwise flow through the differential current-sensing amplifier.

The amplifier further includes a NOR gate, and the switches include a first switch, a second switch, a third switch, a fourth switch, and a fifth switch. The first switch is connected between the first output and around and is turned off to compare the current to be sensed in relation to the reference current. The second switch is connected between the second output and ground and is turned off to compare the current to be sensed in relation to the reference current. The third switch is connected between the inverters and power and is turned on to compare the current to be sensed in relation to the reference current. The fourth switch connects the current to be sensed to a point between the first resistor and the first inverter. The fifth switch connects the reference current to a point between the second resistor and the second inverter. The NOR gate has inputs connected to the first and the second outputs, and an output controlling the fourth and the fifth switches.

Still other aspects and embodiments of the invention will become apparent by reading the detailed description that follows, and by referring to the accompanying drawings. Advantages of at least some embodiments of the invention are presented within the detailed description.

BRIEF DESCRIPTION OF THE DRAWINGS

The drawings referenced herein form a part of the specification. Features shown in the drawings are meant as illustrative of only some embodiments of the invention, and not of all embodiments of the invention, unless otherwise explicitly indicated, and implications to the contrary are otherwise not to be made.

DETAILED DESCRIPTION OF THE DRAWINGS

In the following detailed description of exemplary embodiments of the invention, reference is made to the accompanying drawings that form a part hereof, and in which are shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1A:
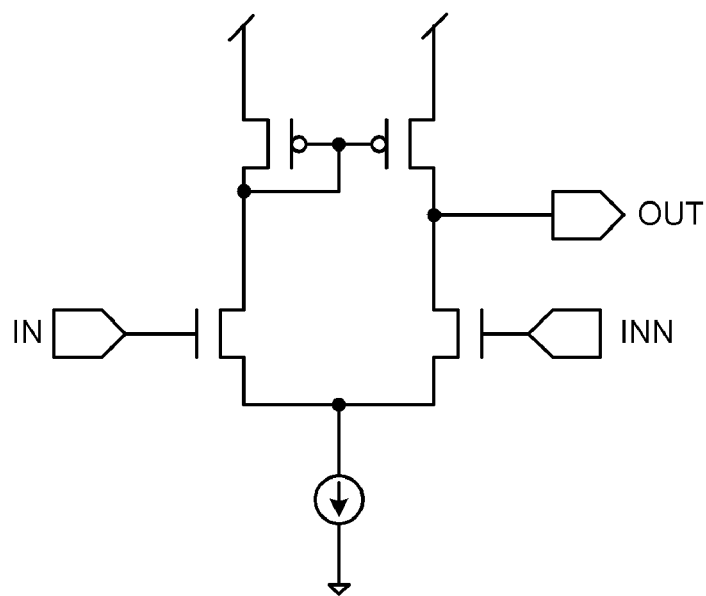
FIGS. 1A and 1B are diagrams of conventional sense amplifiers, according to the prior art.
Figure 1B:
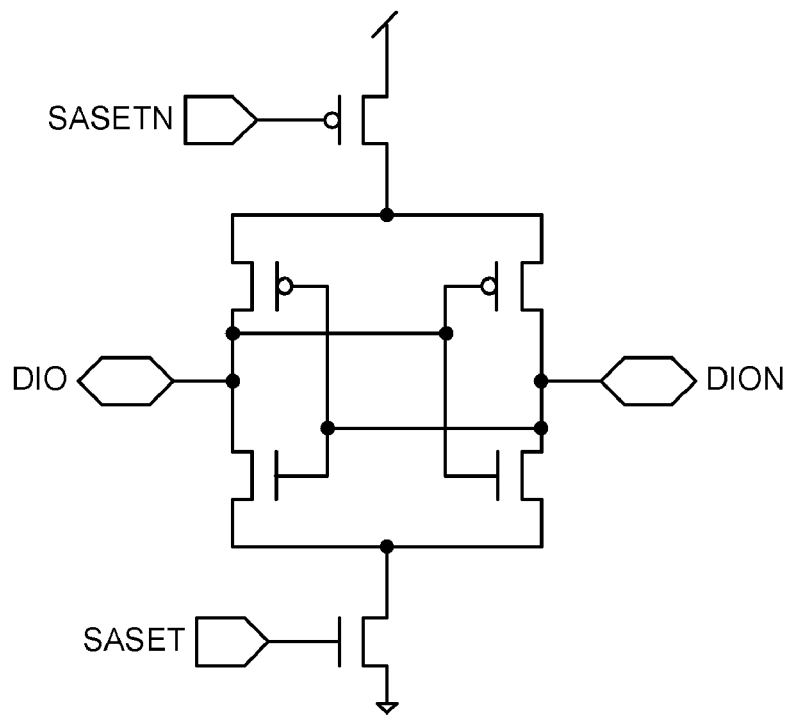
Figure 2:
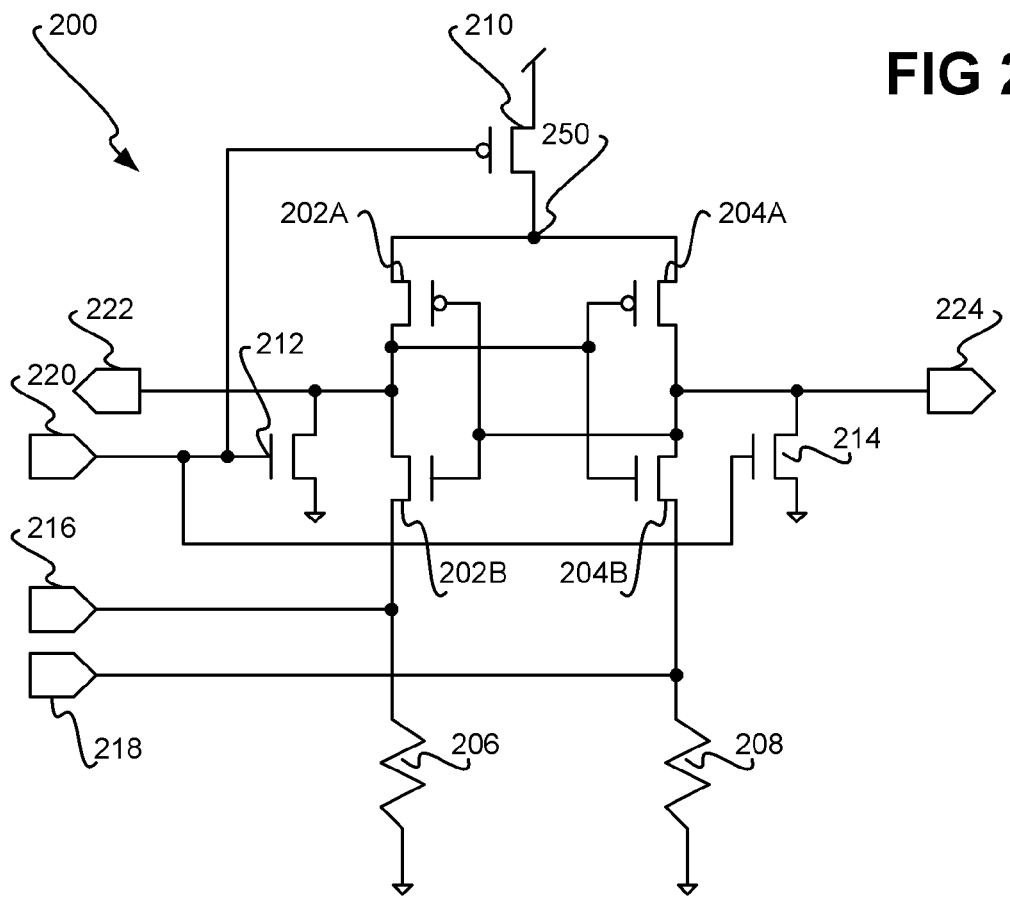
FIG. 2 is a diagram of a differential current-sensing amplifier, according to an embodiment of the invention.

FIG. 2 shows a differential current-sensing amplifier 200, according to an embodiment of the invention. The current-sensing amplifier 200 includes a first inverter made up of two transistors 202A and 202B, collectively referred to as the transistors 202, in series with one another. The transistors 202 are more generally switches. The transistor 202A may be a p-type metal oxide semiconductor field-effect transistor (p-MOSFET) and the transistor 202B may be an n-MOSFET. The amplifier 200 also includes a second inverter made up of two transistors 204A and 204B, collectively referred to as the transistors 204, in series with one another. The transistors 204 are more generally switches, where the transistor 204A may be a p-MOSFET and the transistor 204B may be an n-MOSFET.

The differential current-sensing amplifier 200 includes a first resistor 206 that is connected in series between the transistor 202B of the first inverter and ground, and a second resistor 208 that is connected in series between the transistor 204B of the second inverter and ground. A first transistor 210, which is more generally a switch and which may be a p-MOSFET, is connected between the transistors 202A and 204A of the inverters and power. A second transistor 212, which is more generally a switch and which may be an n-MOSFET, is connected between the transistors 202A and 202B of the first inverter and ground. A third transistor 214, which is more generally a switch and which may be an n-MOSFET, is connected between the transistors 204A and 204B of the second inverter and ground.

The first inverter includes a first output terminal 222 connected between the transistors 202A and 202B, and to which the transistor 212 and the gate terminals of transistors 204 are connected. The second inverter includes a second output terminal 224 connected between the transistors 204A and 204B, and to which the transistor 214 and the gate terminals of transistors 202 are connected. A first input terminal 216 is connected between the transistor 202B of the first inverter and the resistor 206, and the current to be sensed is input at the terminal 216. A second input terminal 218 is connected between the transistor 204B of the second inverter and the resistor 208, and a reference current, against which the current to be sensed is compared, is input at the terminal 218. A switch-control terminal 220 is connected to the gates of the transistors 210, 212, and 214.

The differential current-sensing amplifier 200 operates as follows. The current to be sensed is input at the terminal 216, and the reference current is input at the terminal 218. Thereafter, the switch-control terminal 220 is switched from high to low. This turns off the transistors 212 and 214, such that the output terminals 222 and 224 are no longer tied to ground. This also turns on the transistor 210. If the current to be sensed is greater than the reference current, then the output terminal 222 is high. If the current to be sensed is less than the reference current, then the output terminal 222 is low and the output terminal 224 is high.

More specifically, in a standby mode, the switch-control terminal 220 is high, and the differential current-sensing amplifier 200 is not activated. At this time, the transistor 210 is turned off, and the output terminals 222 and 224 are fixed at ground potential by transistors 212 and 214, respectively. As a result, the gates of transistors 202A and 204A are also at ground potential, and the node 250 falls to the threshold voltage of the transistors 202A and 204A. In this state, then, there is no path within which current can flow.

After the current to be sensed has been input at the input terminal 216 and the reference current has been input at the input terminal 218, sense amplification begins. For descriptive purposes, the situation in which the current to be sensed is greater than the reference current is presented. However, those of ordinary skill within the art can appreciate that the description presented is reversed where the current to be sensed is less than the reference current.

The switch-control terminal 220 is switched from high to low. This turns on the transistor 210, and activates the differential current-sensing amplifier 200. The transistors 212 and 214 are switched off, thus cutting off the output terminals 222 and 224 from ground. (It is noted that the transistors 212 and 214 may be turned off by a signal other than the signal present on the switch-control terminal 220, as in the embodiment of FIG. 2.) The electric potential at the node 250 begins to rise. The electric potential of the gate terminals of the transistors 202A and 204A are initially at ground, and so as the potential of the node 250 rises, they turn on.

Therefore, through the transistors 202A and 204A, current from the power supply flows within the differential current-sensing amplifier 200 to the output terminals 222 and 224.

The sizes and properties of the transistors 202A and 204A are identical, so that the current flowing through these transistors 202A and 204A is likewise equal. When the current flows to the output terminals 222 and 224, the potential at these nodes rises and the transistors 202B and 204B are turned on. At this time, amplification begins.

The resistors 206 and 208 have the same resistance in one embodiment. In the situation where the current to be sensed input at the terminal 216 is greater than the reference current at the terminal 218, the current through the resistor 206 is larger than the current through the resistor 208. Therefore, the potential at the input terminal 216 is greater than the potential at the input terminal 218. The input terminal 216 is connected to the source of the transistor 202B, whereas the input terminal 218 is connected to the source of the transistor 204B. Therefore, the source potential of the transistor 202B is greater than the source potential of the transistor 204B.

When amplification starts, the electric potential of the gate terminals of these transistors 202B and 204B is equal. Therefore, the transistor 204B turns on first, and the electrical charge of the output terminal 224 is discharged to the ground through the transistor 204B and the resistor 208. As a result, the electric potential at the output terminal 224 only slightly increases. By comparison, at the input terminal 216 a larger current than that at the input terminal 218 is asserted, to suppress the current flowing through the transistor 202B. When amplification starts, the transistor 202B is not completely turned on such that the current flowing therethrough is low. As a result, the electric potential at the output terminal 222 rises more significantly as compared to that at the output terminal 224.

The output terminal 222 is connected to the gate terminal of the transistor 204B, such that the on-state of the transistor 204B becomes stronger, lowering the electric potential at the output terminal 224. Due to the decrease in potential at the output terminal 224, the transistor 202B moves towards off, and the electric potential at the output terminal 222 rises further. Thus, there is strong positive feedback between the potential relationship between the output terminals 222 and 224, and within a short period of time, the output terminal 222 is amplified to the potential of the power source, and the output terminal 224 is amplified to the electrical potential at the terminal 218. Namely, the amplifier 200 is a high-speed amplifier.

For example, consider the situation in which the resistance of both the resistors 206 and 208 is 1,000 ohms, the current corresponding to a logic one is 0.1 milliamps, the current corresponding to logic zero is 0.01 milliamps, and the reference current is 0.055 milliamps. The electric potential of the output terminal 224 after amplification is thus 55 millivolts. By comparison, the electric potential at the input terminal 216 is 100 millivolts. Accordingly, so long as the input current at the terminal 216 is flowing, the gate electrical potential of the transistor 202B is less than the source electrical potential, turning off the transistor 202B. If the current input at the terminal 216 is shut off after amplification and only the reference current at the input terminal 218 remains, the electrical potential at the input terminal 216 is equal to ground, and thus zero volts. As a result, the gate electrical potential is higher than the source electric potential by 55 millivolts. However, this value is sufficiently small compared with the threshold voltage of a conventional n-MOSFET, for instance, so that the transistor 202B remains off.

Therefore, in a steady state after amplification, the transistors 202B and 204A are turned off, such that no current flows within the sense amplifier. At this time, the pair of inverters is working as a static latch, and even if the current input at the terminal 216 and/or at the terminal 218 are turned off, the state of the output terminals 222 and 224 do not change, apart from the low level decreasing to ground. Even in the case where the input data state reverses from the initial state, no change is observed apart from a small change to the electrical potential at the low level. Furthermore, no matter how the input current changes, so long as the electrical potential at the input terminals 216 and 218 does not exceed the threshold level of an n-MOSFET, there is no change in the state of the amplifier 200 apart from a change to the electrical potential of the low level output. In other words, regardless of how the input terminals 216 and 218 change as to their current, the state of the amplifier 200 itself as a logic circuit does not change.

As a result, in an electrical device in which the differential current-sensing amplifier 200 is employed, while the amplifier 200 is activated, the next data read cycle can be started. This shortens the cycle time period within the electrical device. Once amplification and sensing have been achieved and the amplified results are no longer required, the switch-control terminal 220 can be returned to high, such that the transistor 210 is turned off, and the transistors 212 and 214 are turned on. As a result, the amplifier 200 returns to a standby state in which no current flows therethrough.

It is noted that the electric potential at the low outputting terminal 222 or 224 (i.e., the terminal 222 where the current at the terminal 216 is smaller than the current at the terminal 218, and otherwise the terminal 224) is not the same as the potential of the ground to which the resistors 206 and 208 are connected. However, if the resistors used for sensing (i.e., resistors 206 and 208) have sufficiently small resistances, the electrical potential at this output terminal in question is substantially close to the ground potential. Even in this situation, therefore, the current flowing through the inverters is zero before and after momentarily being non-zero during amplification. Thus, current is not consumed except during a small transition time during amplification, such that the amplifier 200 is a low-power-consumption amplifier.

Unlike the prior art, in which not only amplifier itself consumes DC current but also bias circuits may be needed for amplification, no such bias voltages are needed in embodiments of the invention (viz., the amplifier 200 is a single-stage amplifier). Furthermore, the amplification to the levels or close to the levels of the power source voltage and ground potential with a single stage means that no further amplifier circuit is needed within a subsequent stage, in contradistinction to prior art amplifiers. The subsequent amplifier or back-end amplifier, if it exists, consumes direct current from power supply to the ground because it receives an intermediate potential as its input from the first stage amplifier. Since the amplifier of the present invention itself does not consume DC current, and since there are no bias circuits, for the first stage amplifier, that both consume direct current, nor no subsequent amplifier that also consumes direct current, not only the amplifier of the present invention itself is low-power-consumption amplifier, but also the amplifier of the present invention makes the total sense system low-power.

As noted above, the amplifier 200 also operates as a static latch, such that as long as the switch-control input 220 remains high, the amplified results at the outputs 222 and 224 are preserved statically. Therefore, cycle time can be reduced, because the next operation can be proceeded too while retaining the output from the current operation. That is, the latch functionality of the differential current-sensing amplifier 200 enables cycle time to be reduced.

Figure 3:
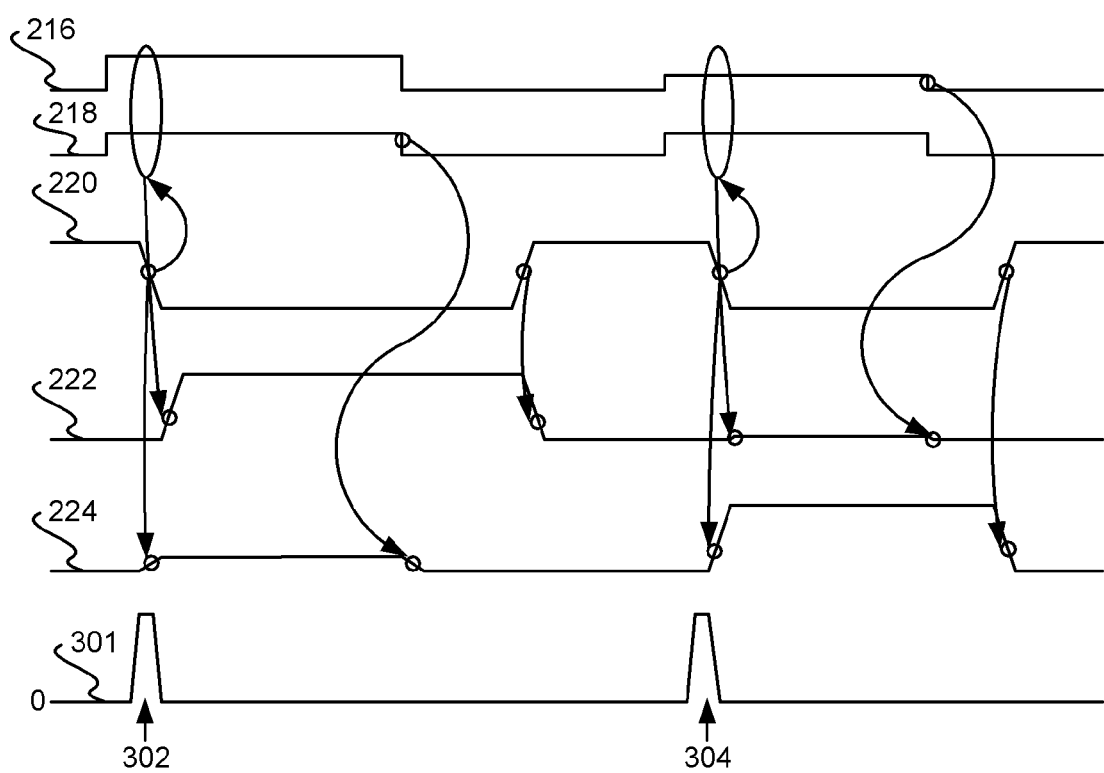
FIG. 3 is a timing diagram depicting representative operation of the differential current-sensing amplifier of FIG. 2, according to an embodiment of the invention.

FIG. 3 shows a timing diagram illustrating operation of the differential current-sensing amplifier 200, according to an embodiment of the invention. Prior to point 302, the switch-control terminal 220 is high, such that the output terminals 222 and 224 are low due to their being tied to ground via the transistors 212 and 214. The current to be sensed, which is high, is input at the input terminal 216, and the reference current is input at the input terminal 218. Thereafter, the switch-control terminal 220 is switched from high to low, as indicated at the point 302.

Switching the switch-control terminal 220 causes the output terminals 222 and 224 to reflect the comparison of the current to be sensed input at the terminal 218 with the reference current input at the terminal 218, by the inverters. In particular, because at point 302 the current to be sensed is greater than the reference current, the output terminal 222 goes high. The output terminal 224 also goes high, but just by a small amount. Two aspects regarding operation of the differential current-sensing amplifier 200 are further particularly noted. First, current from the power supply only momentarily flows through the amplifier 200, as indicated by the line 301 at point 302. Thereafter, current no longer flows through the amplifier 200, which results in the amplifier 200 consuming low power. Second, so long as the switch-control terminal 220 remains low, the potentials at the output terminals 222 and 224 remain valid, even though the input signals disappear, as indicated by the lines 216 and 218, and even though current from the power supply only momentarily flows through the amplifier 200.

Between points 302 and 304 in FIG. 3, the switch-control terminal 220 goes back high. Thereafter, the current to be sensed that is input at the terminal 216 is low. The reference current is again input at the terminal 218. The switch-control terminal 220 is again switched from high to low, as indicated at the point 304. This causes the output terminals 222 and 224 to reflect the comparison of the current to be sensed with the reference current, by the inverters. In particular, because at point 304 the current to be sensed is less than the reference current, the output terminal 224 goes high. The output terminal 222 also goes high, but just by a small amount. The same two aspects regarding operation of the differential current-sensing amplifier 200 are particularly noted here as well. First, current from the power supply only momentarily flows through the amplifier 200, as indicated by the line 301 at point 304. Second, so long as the switch-control terminal 220 remains low, the potentials at the output terminals 222 and 224 remain valid, even though the input signals disappear, as indicated by the lines 216 and 218, and even though current from the power supply only momentarily flows through the amplifier 200.

Figure 4:
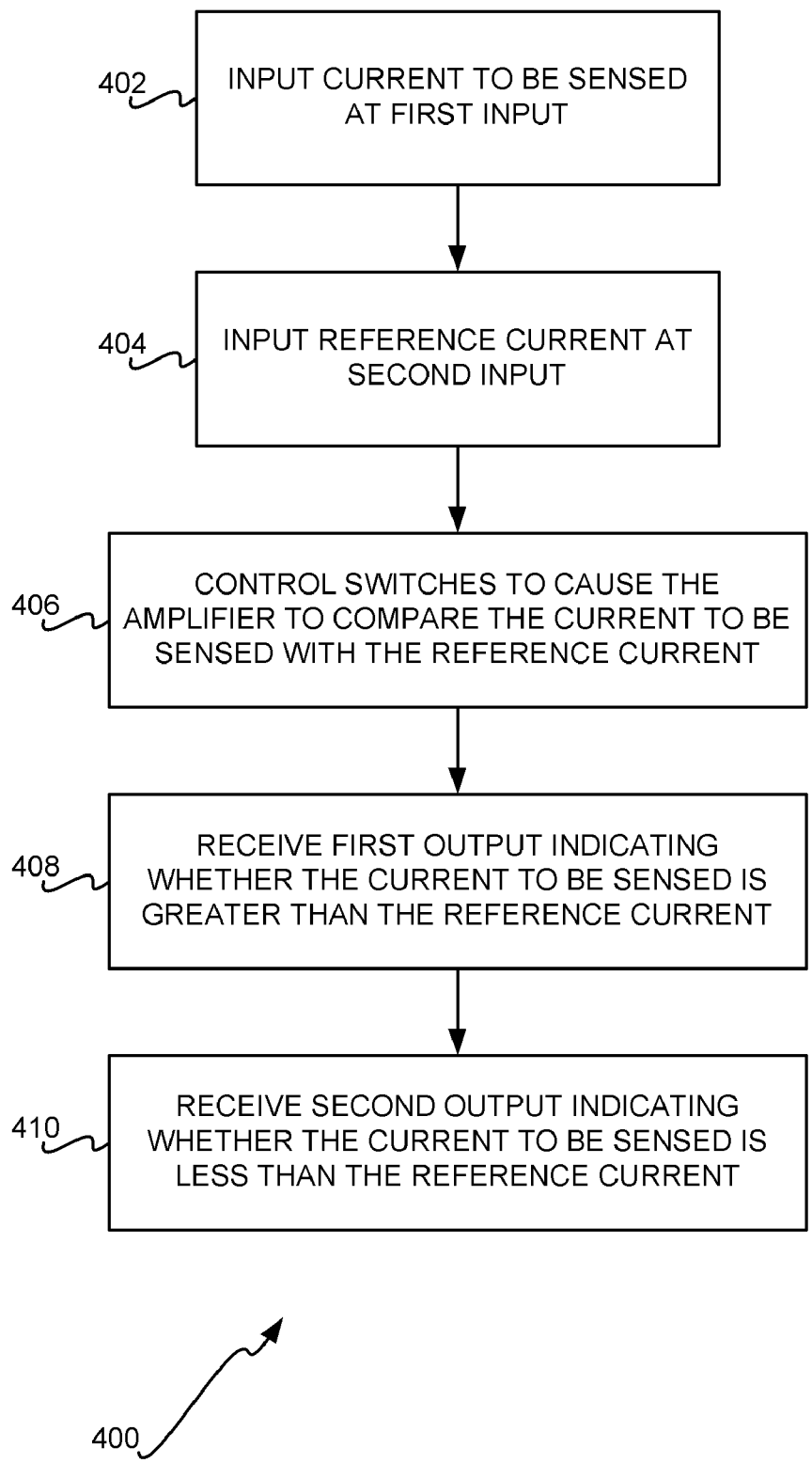
FIG. 4 is a flowchart of a method for using the differential current-sensing amplifier of FIG. 2, according to an embodiment of the invention.

FIG. 4 shows a method 400 for using the differential current-sensing amplifier 200, according to an embodiment of the invention. The current to be sensed is input at the first input terminal 216 (402). The reference current is input at the second input terminal 218 (404). The transistors, or switches, 210, 212, and 214 are controlled to cause the amplifier 200 to compare the current at the terminal 216 in relation to the reference current at the terminal 218 (406). Such control may be by switching the signal at the switch-control terminal 220 from high to low, for instance.

The method 400 receives an output at the first output terminal 222 that indicates whether the current at the terminal 216 is greater than the reference current at the terminal 218 (408). That is, where the former current is greater than the latter current, the output at the first output terminal 222 is high. The method 400 further receives an output at the second output terminal 224 that indicates whether the current at the terminal 216 is less than the reference current at the terminal 218 (408). That is, where the former current is less than the latter current, the output at the second output terminal 224 is high. The output at the second output terminal may not be received, because the output of the second output terminal is the inverted signal of the output at the first output terminal.

Figure 5:
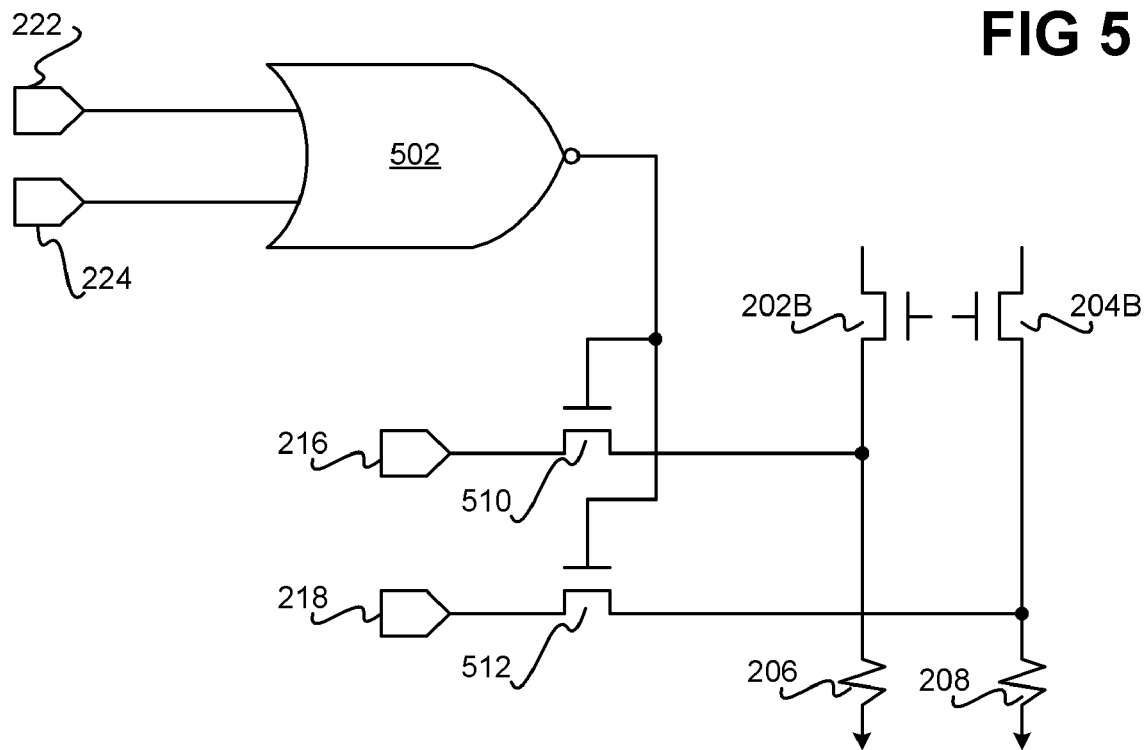
FIG. 5 is a diagram depicting a modification of the differential current-sensing amplifier of FIG. 2, according to an embodiment of the invention.

FIG. 5 shows a modification that can be made to the differential current-sensing amplifier 200 of FIG. 2, according to an embodiment of the invention. It is noted that the entire amplifier 200 is not depicted in FIG. 5, but rather just those components needed to understand the modification provided in FIG. 5, as can be appreciated by those of ordinary skill within the art. In particular, the output terminals 222 and 224 are connected to inputs of a NOR gate 502. Furthermore, the output of the NOR gate 502 is connected to the gate terminals of n-MOSFET's 510 and 512 added at the current signal input terminals 216 and 218. The n-MOSFET's 510 and 512 are more generally switches. The result of adding the NOR gate 502 and the n-MOSFET's 510 and 512 is that the input signals at the input terminals 216 and 218 are cut off after sense amplification by the amplifier 200 has been completed. As a result, the electrical potential at one of the output terminals 222 and 224 which outputs logical "L" level is equal to the ground potential.

Figure 6:
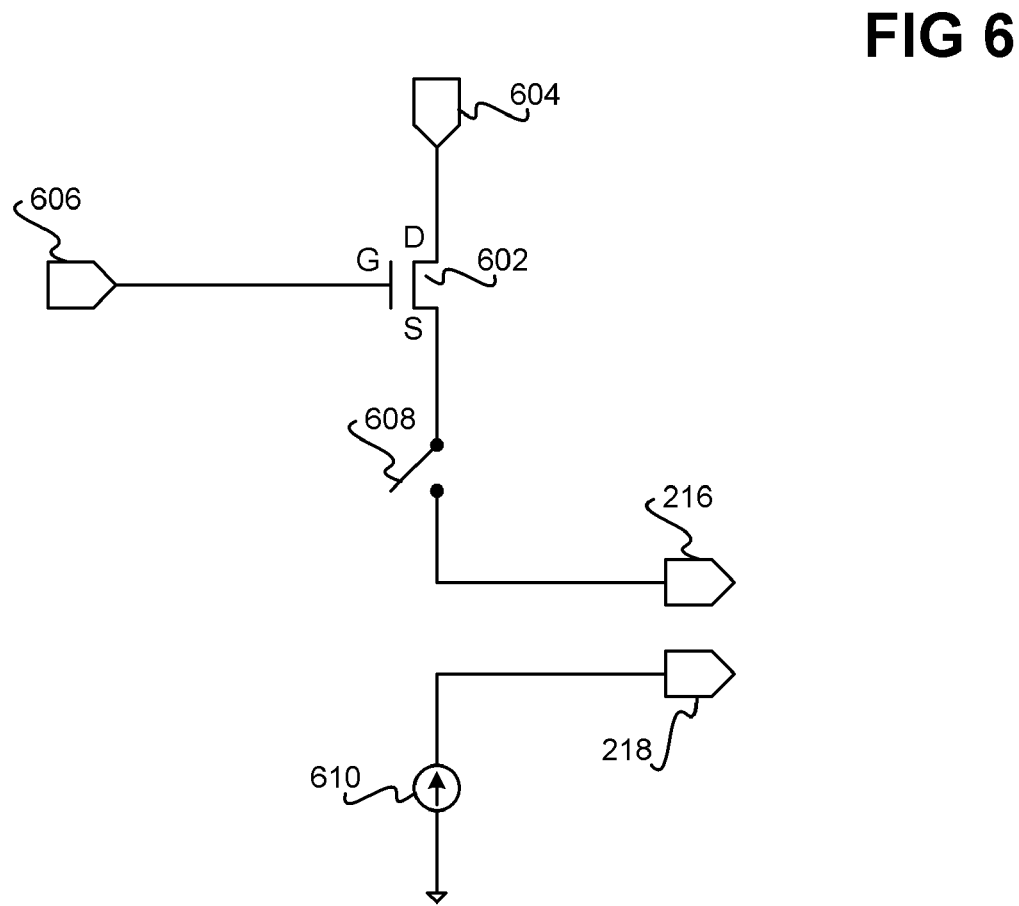
FIG. 6 is a diagram depicting a representative memory cell and reference current source as connected to the differential current-sensing amplifier of FIG. 2, according to an embodiment of the invention.

FIG. 6 depicts a representative memory cell 602 in relation to which the differential current-sensing amplifier 200 of FIG. 2 can be employed, according to an embodiment of the invention. The memory cell 602 has a drain D, a gate G, and a source S. The drain D is connected to a terminal 604 and the gate G is connected to a terminal 606. The source S of the memory cell 602 is connected to the input terminal 216 via a switch 608. The other input terminal 218 is connected to a reference current source 610. By closing the switch 608, the memory cell 602 is communicatively connected to the amplifier 200, such that the logic value stored within the memory cell 602 is read by the amplifier 200. Particularly, the current flowing through the cell 602, when the terminal 606 provides an on signal to the cell and power is provided at the terminal 604, is compared against the reference current provided by the current source 610.

It is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. Therefore, it is manifestly intended that this invention be limited only by the claims and equivalents thereof.

I claim:

1. A differential current-sensing amplifier comprising:
    a first inverter having a first output;
    a second inverter having a second output;
    a first resistor connected between the first inverter and ground, a current to be sensed input between the first resistor and the first inverter;
    a second resistor connected between the second inverter and ground, a reference current in relation to which the current to be sensed is compared input between the second resistor and the second inverter;
    a first switch connected between the first output and ground, the first switch turned off to compare the current to be sensed in relation to the reference current;
    a second switch connected between the second output and ground, the second switch turned off to compare the current to be sensed in relation to the reference current;

a third switch connected between the first and the second inverters and power, the third switch turned on to compare the current to be sensed in relation to the reference current;

a fourth switch connecting the current to be sensed to a point between the first resistor and the first inverter;

a fifth switch connecting the reference current to a point between the second resistor and the second inverter; and, a NOR gate having inputs connected to the first and the second outputs, and an output controlling the fourth and the fifth switches.

2. The differential current-sensing amplifier of claim 1, wherein the first output is high when the current to be sensed is greater than the reference current, the first and second switches have been turned off, and the third switch has been turned on.

3. The differential current-sensing amplifier of claim 1, wherein the second output is high when the current to be sensed is less than the reference current, the first and second switches have been turned off, and the third switch has been turned on.

4. The differential current-sensing amplifier of claim 1, wherein current just momentarily flows through the differential current-sensing amplifier, only after the first and the second switches have been turned off and the third switch has been turned on, and current does not otherwise flow through the differential current-sensing amplifier.

5. The differential current-sensing amplifier of claim 1, wherein the first inverter comprises a pair of switches serially connected to one another, where the first output is situated between the switches, and wherein the second inverter comprises a pair of switches, wherein the second output is situated between the switches.

6. The differential current-sensing amplifier of claim 5, wherein each switch of the first and the second inverters comprises a transistor.

7. The differential current-sensing amplifier of claim 1, wherein each of the first, second, and third switches comprises a transistor.

8. The differential current-sensing amplifier of claim 1, wherein a potential at one of the first and the second outputs is substantially close to, but not exactly equal to, a potential at ground.

9. The differential current-sensing amplifier of claim 1, wherein a potential at one of the first and the second outputs is equal to a power supply potential.

10. The differential current-sensing amplifier of claim 1, wherein each of the fourth and fifth switches comprises a transistor.

11. A differential current-sensing amplifier comprising:
a first input to receive a current to be sensed;
a second input to receive a reference current;
a first output indicating whether the current to be sensed is greater than the reference current;
a second output indicating whether the current to be sensed is less than the reference current;
a NOR gate; and,
a plurality of switches to control comparing of the current to be sensed in relation to the reference current,
wherein current just momentarily flows through the differential current-sensing amplifier, only after the switches have been actuated to control comparing of the current to be sensed in relation to the reference current, and current does not otherwise flow through the differential current-sensing amplifier,
wherein the switches comprise:
a first switch connected between the first output and ground and turned off to compare the current to be sensed in relation to the reference current;
a second switch connected between the second output and ground and turned off to compare the current to be sensed in relation to the reference current;
a third switch connected between the inverters and power and turned on to compare the current to be sensed in relation to the reference current;
a fourth switch connecting the current to be sensed to a point between the first resistor and the first inverter; and,
a fifth switch connecting the reference current to a point between the second resistor and the second inverter, and
wherein the NOR gate has inputs connected to the first and the second outputs, and an output controlling the fourth and the fifth switches.

12. The differential current-sensing amplifier of claim 11, further comprising:
a first inverter providing the first output;
a second inverter providing the second output;
a first resistor connected between the first inverter and ground, the first input connected between the first resistor and the first inverter; and,
a second resistor connected between the second inverter and ground, the second input connected between the second resistor and the second inverter.

13. The differential current-sensing amplifier of claim 11, wherein a potential at one of the first and the second outputs is substantially close to, but not exactly equal to, a potential at ground.

14. The differential current-sensing amplifier of claim 11, wherein a potential at one of the first and the second outputs is equal to a power supply potential.

* * * * *